United States Patent [19]

Grousseau

[11] 4,308,620
[45] Dec. 29, 1981

[54] SYSTEM FOR MAINTAINING PHASE COINCIDENCE BETWEEN A CARRIER WAVE AND SIDEBANDS PRODUCED BY A TRANSMITTER

[75] Inventor: Alain Grousseau, Paris, France

[73] Assignee: Thomson-CSF, Paris, France

[21] Appl. No.: 845,772

[22] Filed: Oct. 26, 1977

[30] Foreign Application Priority Data

Oct. 29, 1976 [FR] France .................................. 76 32713

[51] Int. Cl.³ .............................................. H04B 1/04
[52] U.S. Cl. ...................................... 455/75; 343/102;
455/119; 455/126
[58] Field of Search ............... 325/135, 136, 137, 144,
325/159, 184, 50, 138; 332/37 D, 42, 45, 48;
343/102; 455/75, 103, 104, 119, 109, 126, 46,
47, 48

[56] References Cited

U.S. PATENT DOCUMENTS 3,117,319 1/1964 Stover ................................. 343/102
3,938,155 2/1976 Mears et al. ........................ 325/138
3,984,778 10/1976 Bhopale ................................ 325/50

*Primary Examiner*—Joseph A. Orsino, Jr.
*Attorney, Agent, or Firm*—Karl F. Ross

[57] ABSTRACT

To maintain a cophasal relationship between two concurrently transmitted waves of the same high frequency derived from a common pilot oscillator, one of these waves being modulated by a low-frequency signal, a phase shifter in cascade with the modulator is controlled by a phase discriminator including a comparator with inputs receiving the two high-frequency waves. An analog multiplier driven by the low-frequency modulating signal converts an error signal from the phase comparator into a unipolar pulsating voltage which, upon integration, yields a control voltage adjusting the phase shifter to correct any relative phase displacement.

7 Claims, 5 Drawing Figures

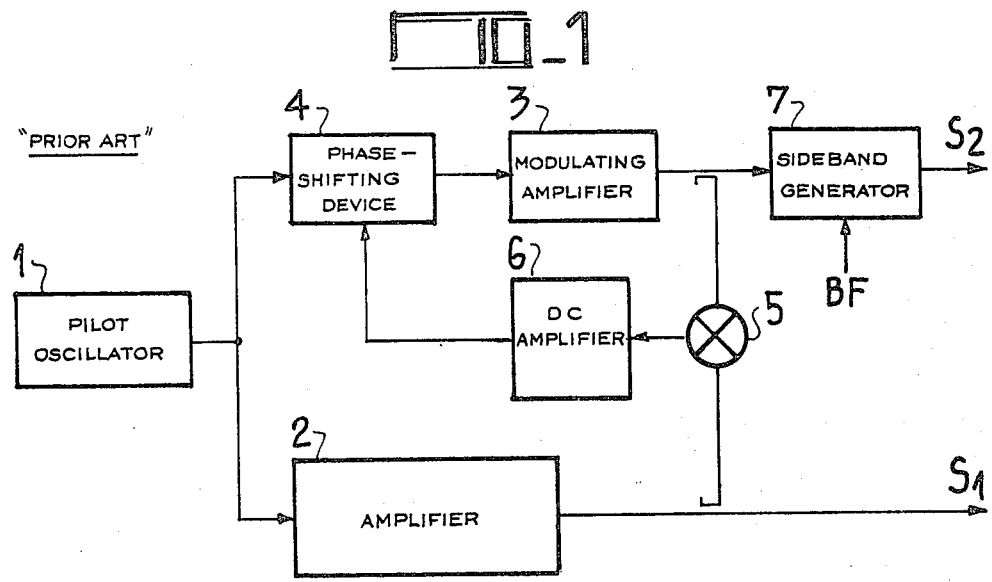
FIG_1
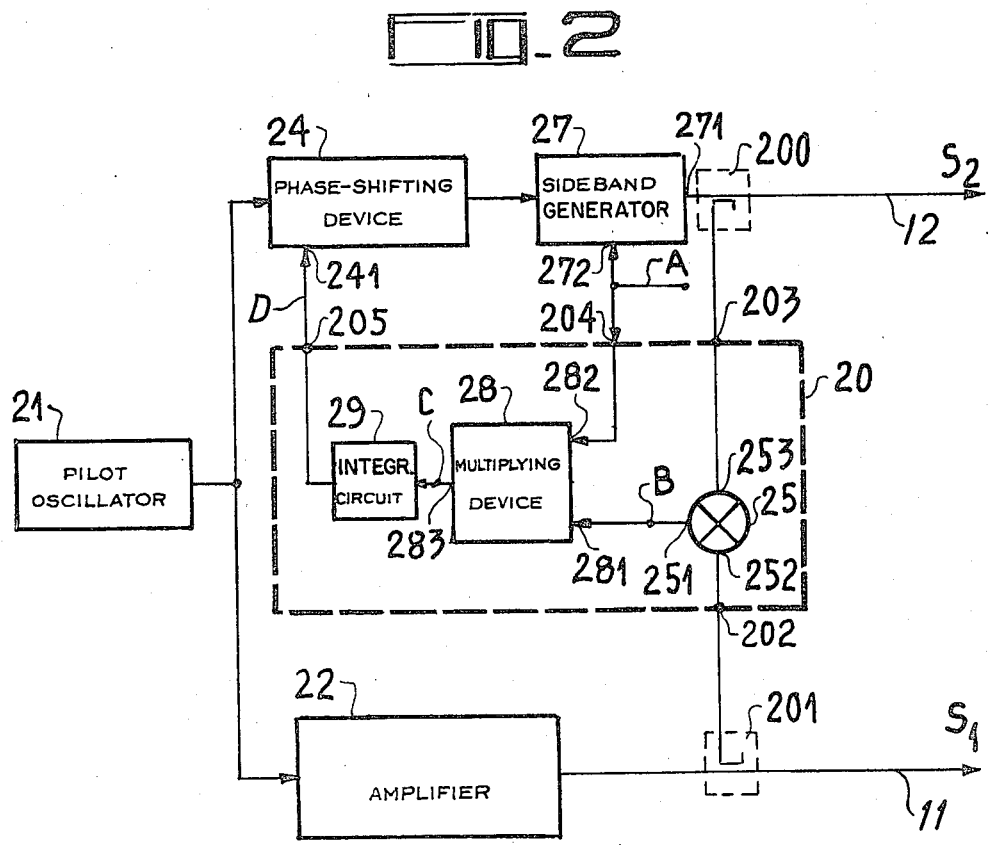
FIG_2

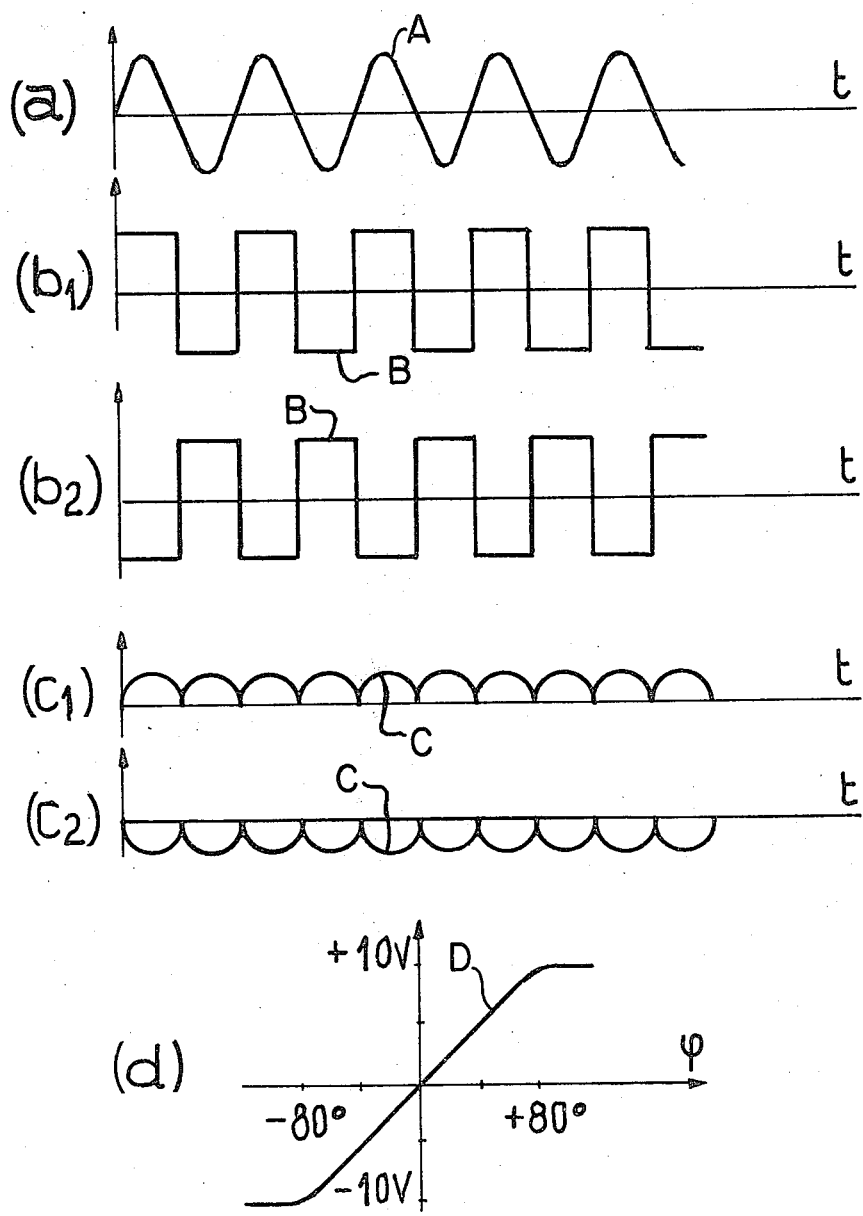

SYSTEM FOR MAINTAINING PHASE COINCIDENCE BETWEEN A CARRIER WAVE AND SIDEBANDS PRODUCED BY A TRANSMITTER

FIELD OF THE INVENTION

The present invention relates to a system for controlling the relative phase of two high-frequency oscillations, i.e. a carrier wave and associated sidebands, produced by a transmitter.

BACKGROUND OF THE INVENTION

Some radio transmitting systems employ the possibility of adding in space the signals concurrently sent out by two separate transmission sources. In order that the resulting field be able to represent the sum of the fields of the two transmission sources, it is essential that the phases of the high-frequency waves constituting the carrier wave and the sidebands, for example in the case of radio-navigation signals, correspond to each other with fidelity. The radio-navigation transmitting systems known as V.O.R. or I.L.S. employ phase-controlling devices. Such devices such as that shown in FIG. 1 comprise a pilot oscillator 1 emitting simultaneously over two amplifying channels a signal whose frequency is equal to the frequency of the carrier wave. An amplifier 2, possibly including an amplitude-modulating stage, delivers the carrier wave in the first channel whereas a modulating amplifier 3 preceded by a phase-shifting device 4 delivers a second signal whose frequency is identical to that of the carrier wave and whose phase is fixed with respect to the latter. A phase comparator or mixing stage 5 connected to the outputs of the amplifiers 2 and 3 delivers, after filtering of the difference signal, a continuous voltage or error signal which exactly measures the phase difference between the high-frequency signals delivered by the two amplifiers. The error signal, after amplification by a direct-current amplifier 6, is used to control the analog phase shifter 4 and to lock the signals delivered by the amplifier 3 in phase with those delivered by the amplifier 2. The high-frequency output signal of amplifier 3, phase-controlled by the carrier wave $S_1$ issuing from amplifier 2, is fed to a sideband generator 7 controlled in a conventional manner by a low-frequency modulation signal BF to produce a sideband signal $S_2$.

Such devices permit a stabilization of the phase of the high-frequency signal $S_2$ only if the sideband generator 7 has a very high intrinsic stability since that generator is not included in the regulating loop. This intrinsic stability of the sideband generator requires an operation of the latter at a high level. The incorporation of the sideband generator in the regulating loop cannot be achieved directly with such devices, the phase of the high-frequency signals $S_2$ being inverted by $\pi$ every semi-period of the low-frequency modulation signal BF. The direction of the phase drift can therefore not be determined.

OBJECTS OF THE INVENTION

An object of the present invention is to provide improved means for controlling the relative phase of a carrier wave and an associated sideband oscillation of the same frequency.

Another object of my invention is to provide a sideband generator which has a very high phase stability with respect to the carrier wave while operating at a low level.

SUMMARY OF THE INVENTION

A system according to my present invention includes phase-comparison means, such as the aforementioned mixer stage, with inputs connected to the two channels serving for the transmission of the two high-frequency waves between which a substantially cophasal relationship is to be maintained, the comparison means thus receiving the carrier wave from the first transmission channel and the associated sideband oscillation from the second transmission channel to produce an error signal proportional to the relative phase drift. This error signal, changing in polarity between successive half-cycles of the low-frequency signal fed to the modulator in the second channel, is supplied together with the modulating signal to a polarity inverter which converts the error signal into a unipolar control voltage varying in magnitude and sign with the detected phase drift. A phase-shifting device in one of the transmission channels, specifically in the channel containing the modulator which generates and possibly amplifies the sideband oscillation, corrects the phase drift in response to this control voltage.

The system according to my invention is particularly applicable to the phase control of radio-navigation signals sent out, for example, by V.O.R. or I.L.S. transmitters.

BRIEF DESCRIPTION OF THE DRAWING

The above and other features of my invention will be described in detail hereinafter with reference to the accompanying drawing in which:

FIG. 1, already described above, is a block diagram of a conventional phase-control system;

FIG. 2 is a diagram similar to FIG. 1 but showing my present improvement;

FIG. 3 is a set of graphs representing the waveforms of signals appearing at various points in the system of FIG. 2;

FIG. 4b illustrates the response curve of the phase shifter shown in FIG. 4a.

SPECIFIC DESCRIPTION

Figure 4A:
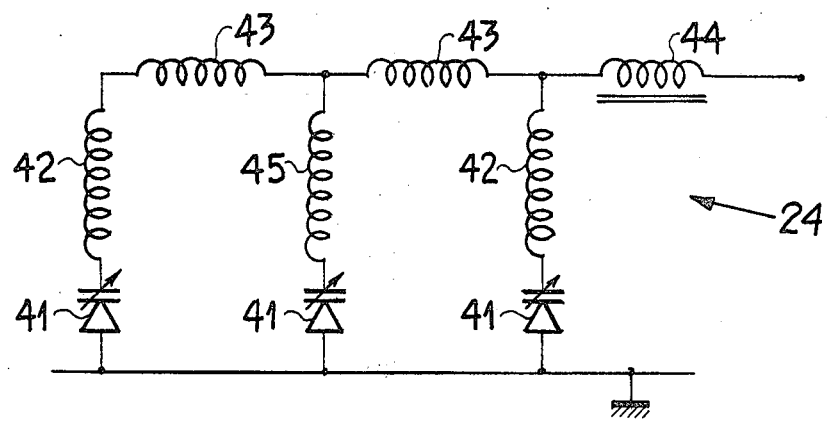
FIG. 4a shows details of a phase shifter included in the system of FIG. 1.

According to FIG. 2, the device according to the invention comprises a pilot oscillator 21 delivering a signal whose frequency $F_o$ is equal to that of the carrier wave $S_1$ to be emitted via a first transmission channel 11 including an amplifier 22; the latter, like amplifier 2 of FIG. 1, could also have a modulating function. The pilot oscillator 21 delivers the same basic signal of frequency $F_o$ to a sideband generator 27 through a phase shifter 24. The output 271 of generator 27 emits the sideband signal $S_2$ on a second transmission channel 12. A phase discriminator 20 comprises two high-frequency input terminals 202 and 203, respectively connected by couplers 201 and 200 to channels 11, 12 and a control input 204 connected to a circuit delivering a low-frequency modulation signal A to a control input 272 of the sideband generator 27. The output terminal 205 of the phase discriminator is connected to the control input 241 of the phase-shifting device 24. The control of the phase discriminator 20 by the low-frequency modulation signal a permits, irrespective of the semi-period of that modulation signal, the determination in magnitude and sign of the phase shift between the two channels 11 and 12, the phase discriminator 20 producing at its output 205 a voltage representing this phase shift in magnitude and sign and permitting the correction of that shift by means of device 24.

According to the specific embodiment shown in FIG. 2, the phase discriminator 20 includes a mixer stage 25 whose input terminals 252 and 253 are respectively connected to couplers 201 and 200. Each of these couplers comprises a sensor constituted, for example, by a resistive circuit or a parallel-band transmission line; the mixer stage 25 is constituted, for example, by a ring modulator. The output 251 of the mixer stage 25 is connected to a first input 281 of a multiplying device 28. The mixer circuit 25 further comprises a filter for delivering at its output 251 an error signal B constituted by a periodic voltaage in the form of a square wave which represents the phase relationship of the two high-frequency oscillations $S_1$ and $S_2$. A second input 282 of the multiplying device 28 receives the modulation signal A fed to the sideband generator 27. The output 283 of the multiplying device 28 is connected to the control input 241 of the phase-shifting device 24 through an integrating circuit 29 for averaging a pulsating signal C delivered by device 28. This integrating circuit is, for example, constituted by a low-pass filter connected in cascade with a direct-current amplifier and generates a control signal D.

The device operates in the following manner. The amplitude of the periodic signals indicated in FIG. 2 have been plotted in FIG. 3 against time. Graph (a) represents the modulation signal A fed to the sideband generator. Graphs ($b_1$) and ($b_2$) show the error signal B respectively appearing in the output 251 of the mixer stage 25 in the case of a phase lead and a phase lag of the carrier wave $S_1$ with respect to the sideband oscillation $S_2$, whereas graphs ($c_1$) and ($c_2$) show the pulsating signal C respectively issuing from the multiplying device 28 in the case of a phase lead and a phase lag of the carrier wave with respect to the sideband oscillation. FIG. 3(d) represents the response curve of the phase-discriminating circuit constituted by the mixer stage or phase comparator 25 and the multiplying device 28, with the magnitude of the integrated control voltage D plotted against the magnitude of the phase shift $\phi$. This response is linear for a phase variation between $+80°$ and $-80°$ and results in the obtainment of a control voltage between $+10$ V and $-10$ V. The modulation signal A, shown as a sine wave in FIG. 3(a), is in phase with the error signal B whose amplitude represents the extent of the phase shift between the carrier wave and the sideband oscillation. The analog multiplication of the error signal B by the modulation signal A yields the unipolar pulsating signal C whose continuous component as obtained from integrator 29 represents the value of the phase shift in amplitude and sign. Thus, analog multiplier 28 acts as a full-wave rectifier which inverts alternate half-cycles of signal A and changes its amplitude according to the detected phase difference. The integrated and amplified signal D controls the phase-shifting device 24.

According to FIG. 4a, the analog phase shifter 24 comprises two $\pi$ networks with shunt branches each constituted by a variable-capacitance diode or varactor 41 which is connected in series with an induction coil 42 or 45. The branches of each network are interconnected by an induction coil 43. The anode of each varactor 41 is connected to ground or to a reference voltage of the device. The varactors 41 are biased by means of a choke coil 44. The phase-shifting control voltage applied to the input 241 (FIG. 2) of the analog phase shifter 24 is superimposed on the biasing voltage of varactors 41 by an adder amplifier not shown. In the absence of a phase-shifting control signal the varactors 41 have a capacitance of 15 pF. The outer shunt coils 42 have an inductance of 44 nH and the series coils 43 have an inductance of 60 nH. The middle shunt coil 45 has an inductance of 88 nH corresponding to twice that of each outer coil 42.

Figure 4B:
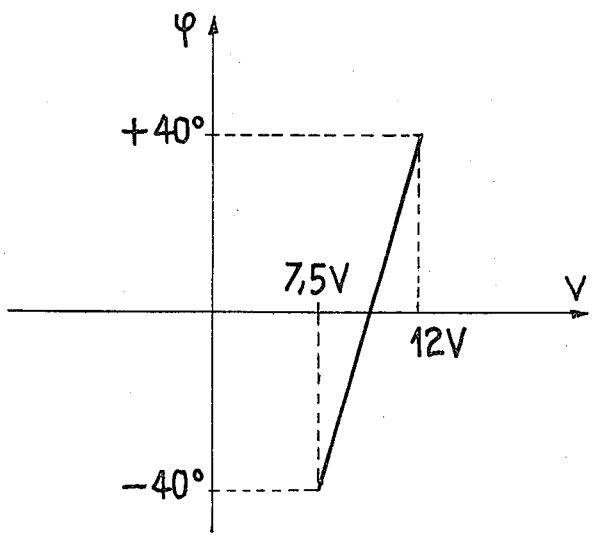

FIG. 4b shows the response of the analog phase-shifting device 24 according to FIG. 4a. A linear phase variation between $-40°$ and $+40°$ is obtained for a control voltage between 7.5 V and 12 V. By way of example, the carrier-frequency generator 21 of FIG. 2 is constituted by a quartz oscillator having a high stability. This oscillator delivers a signal of frequency between 100 MHz and 300 MHz whereas the modulation signal A has a low frequency of 30 Hz in the case of a radio beacon of the V.O.R. type, and of 90 Hz or 150 Hz in the case of navigation signals of the I.L.S. type.

By the present improvement I have been able to achieve, for a correction of phase within less than one degree, a substantial reduction of the input power of the sideband generator from a level of the order of 40 W in the prior-art system to 10 mW in the system according to the invention, which results in a reduced overall size and an increased efficiency.

What is claimed is:

1. A system for maintaining a substantially cophasal relationship between a high-frequency carrier wave generated by a pilot oscillator and transmitted over a first channel and a sideband oscillation derived from said carrier wave and transmitted over a second channel connected to said pilot oscillator, said second channel including modulating means connected to a source of a low-frequency signal for generating said sideband oscillation comprising:

phase-shifting means in one of said channels;

phase-comparison means with inputs connected to said channels for receiving said carrier wave and said sideband oscillation therefrom and producing an error signal proportional to relative phase drift, said error signal changing in polarity between successive half-cycles of said low-frequency signal; and polarity-inverting means with input connections to said phase-comparison means and to said source for converting said error signal into a unipolar control voltage varying in magnitude and sign with said relative phase drift, said polarity-inverting means having an output connected to said phase-shifting means for supplying same with said control voltage to correct said phase drift.

2. A system as defined in claim 1 wherein said phase-shifting means comprises an impedance network with a plurality of shunt arms each including a varactor in series with an inductance, said shunt arms being interconnected by inductive series arms.

3. A system as defined in claim 1 wherein said phase-shifting means is inserted in said second channel ahead of said modulating means.

4. A system as defined in claim 1 wherein said first channel includes amplifying means for said carrier wave.

5. A system as defined in claim 1 wherein said polarity-inverting means comprises an analog multiplier.

6. A system as defined in claim 5 wherein said polarity-inverting means further comprises an integrating circuit following said analog multiplier.

7. A system as defined in claim 6 wherein said integrating circuit comprises a low-pass filter in cascade with a direct-current amplifier.

* * * * *